US010128222B2

(12) United States Patent
Uchida

(10) Patent No.: US 10,128,222 B2
(45) Date of Patent: Nov. 13, 2018

(54) LIGHT-EMITTING-AND-RECEIVING ELEMENT MODULE AND SENSOR DEVICE USING THE SAME

(71) Applicant: KYOCERA CORPORATION, Kyoto-shi, Kyoto (JP)

(72) Inventor: Shinya Uchida, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/512,039

(22) PCT Filed: Sep. 17, 2015

(86) PCT No.: PCT/JP2015/076446
§ 371 (c)(1),
(2) Date: Mar. 16, 2017

(87) PCT Pub. No.: WO2016/047545
PCT Pub. Date: Mar. 31, 2016

(65) Prior Publication Data
US 2017/0294426 A1  Oct. 12, 2017

(30) Foreign Application Priority Data

Sep. 24, 2014 (JP) .................. 2014-193478

(51) Int. Cl.
*H01L 25/16* (2006.01)
*G01S 17/02* (2006.01)
(Continued)

(52) U.S. Cl.
CPC .......... *H01L 25/167* (2013.01); *G01S 7/4813* (2013.01); *G01S 7/4815* (2013.01);
(Continued)

(58) Field of Classification Search
CPC .. H01L 25/167; H01L 31/167; H01L 31/0203
See application file for complete search history.

(56) References Cited

U.S. PATENT DOCUMENTS

2015/0115139 A1* 4/2015 Okushiba .............. G01S 7/4813
250/216

FOREIGN PATENT DOCUMENTS

JP  H5-152603 A   6/1993
JP  H11-223781 A  8/1999
(Continued)

OTHER PUBLICATIONS

Machine Translation of JP-2012-119448.*
(Continued)

*Primary Examiner* — Julia Slutsker
(74) *Attorney, Agent, or Firm* — Procopio Cory Hargreaves and Savitch LLP

(57) ABSTRACT

A light-emitting-and-receiving element module 1 comprises a substrate 2 that comprises a top surface 2a; a light-emitting element 3a on the top surface 2a of the substrate 2; a light-receiving element 3b on the top surface 2a of the substrate 2 and apart from the light-emitting element 3a; and an intermediate wall 5 between the light-emitting element 3a and the light-receiving element 3b, the intermediate wall 5 comprising a lower surface 5c disposed apart from the top surface 2a. The lower surface 5c of the intermediate wall 5 has a protruding shape.

10 Claims, 7 Drawing Sheets

(51) Int. Cl.
    *G01S 7/481*     (2006.01)
    *H01L 31/173*     (2006.01)
    *G01V 8/12*     (2006.01)
    *G01S 17/46*     (2006.01)
    *H03K 17/94*     (2006.01)

(52) U.S. Cl.
    CPC ............ *G01S 17/026* (2013.01); *G01S 17/46* (2013.01); *G01V 8/12* (2013.01); *H01L 31/173* (2013.01); *H03K 17/943* (2013.01)

(56) References Cited

FOREIGN PATENT DOCUMENTS

| | | |
|---|---|---|
| JP | 2000-354091 A | 12/2000 |
| JP | 3450225 B2 | 9/2003 |
| JP | 2007-201360 A | 8/2007 |
| JP | 2012-119448 A | 6/2012 |
| WO | 2013/161722 A1 | 10/2013 |

OTHER PUBLICATIONS

Machine Translation of JP-2000-354091.*
International Search Report dated Dec. 15, 2015 issued by the Japan Patent Office in counterpart International Application No. PCT/JP2015/076446.
Office Action dated Dec. 20, 2017, issued in counterpart Chinese Application No. 201580042710.3.
Office Action dated Nov. 7, 2017, issued in counterpart Japanese Application No. 2016-550148.

* cited by examiner (a)

(b)

LIGHT-EMITTING POINT        LIGHT-RECEIVING POINT

LIGHT-EMITTING-AND-RECEIVING ELEMENT MODULE AND SENSOR DEVICE USING THE SAME

TECHNICAL FIELD

The present invention relates to a light-emitting-and-receiving element module and a sensor device using the same.

BACKGROUND ART

Hitherto, there have been proposed various kinds of sensor devices that detect characteristics of an illumination object by applying light from a light-emitting element to the illumination object and by causing a light-receiving element to receive specularly reflected light and diffusely reflected light from the illumination object. Such sensor devices are used in a wide range of fields, and are used in various applications, such as in photo-interrupters, photocouplers, remote control units, IrDA (Infrared Data Association) communication devices, optical fiber communication devices, and original size sensors.

For example, as described in Japanese Unexamined Patent Application Publication No. 2007-201360, a sensor device including a light-emitting element and a light-receiving element that are disposed on the same substrate and a light-intercepting wall that separates a light-receiving region and a light-emitting region is used.

However, in such a sensor device, light from a gap occurring between the substrate and the light-intercepting wall makes it difficult to increase the sensing performance of the sensor device.

SUMMARY OF INVENTION

One form of a light-emitting-and-receiving element module comprises a substrate that comprises a top surface; a light-emitting element on the top surface of the substrate; a light-receiving element on the top surface of the substrate and apart from the light-emitting element; and an intermediate wall between the light-emitting element and the light-receiving element, the intermediate wall comprising a lower surface disposed apart from the top surface, wherein the lower surface of the intermediate wall has a protruding shape.

Such a form of the sensor device is a sensor device using the above-described light-emitting-and-receiving element module, and detects information about an illumination object in accordance with output electric current from the light-receiving element that is output in accordance with reflected light, produced as a result of applying light from the light-emitting element to the illumination object, from the illumination object.

BRIEF DESCRIPTION OF DRAWINGS

FIG. 1(*b*) is a schematic sectional view taken along line 1I-1I in FIG. 1(*a*).

FIG. 2(*b*) is a sectional view of a light-receiving element of the light-emitting-and-receiving element module in FIG. 1.

DESCRIPTION OF EMBODIMENTS

A light-emitting-and-receiving element module and a sensor device using the same according to embodiments of the present invention are described below with reference to the drawings. The examples below exemplify the embodiments of the present invention. The present invention is not limited to these embodiments. In the light-emitting-and-receiving element module according to the embodiment, any direction may be defined as an upward direction or a downward direction. In the description below, for convenience sake, an orthogonal coordinate system (X, Y, Z) is defined, and a positive side in a Z-axis direction is defined as an upward direction.

(Light-Emitting-and-Receiving Element Module)

Figure 1:
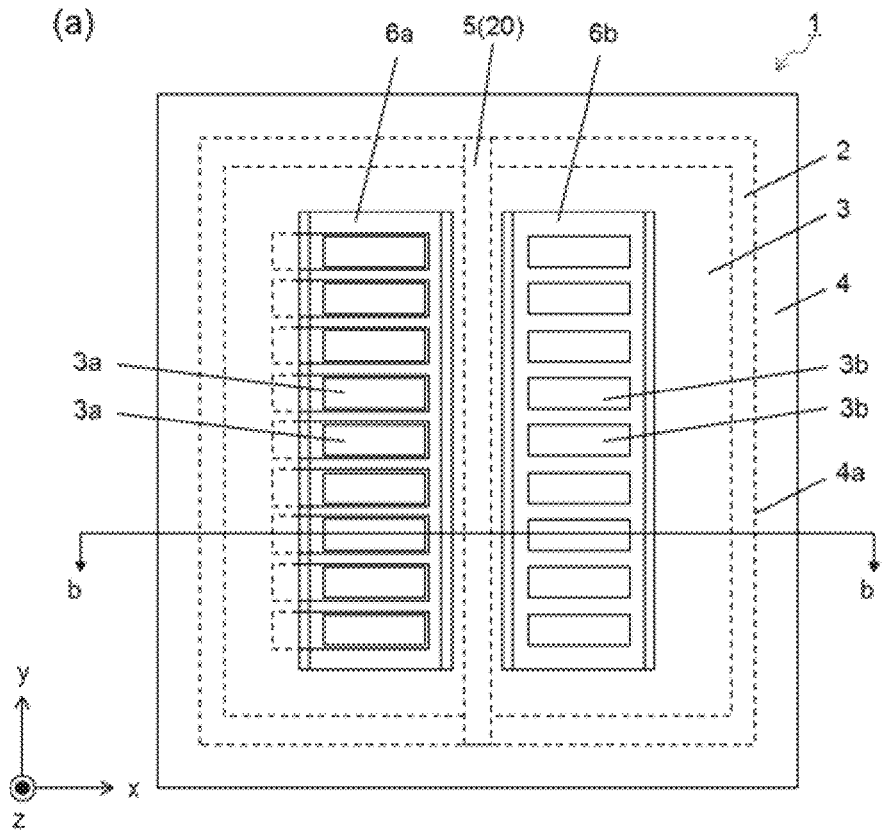
FIG. 1(*a*) is a plan view of a light-emitting-and-receiving element module according to an embodiment of the present invention.
Figure 1:
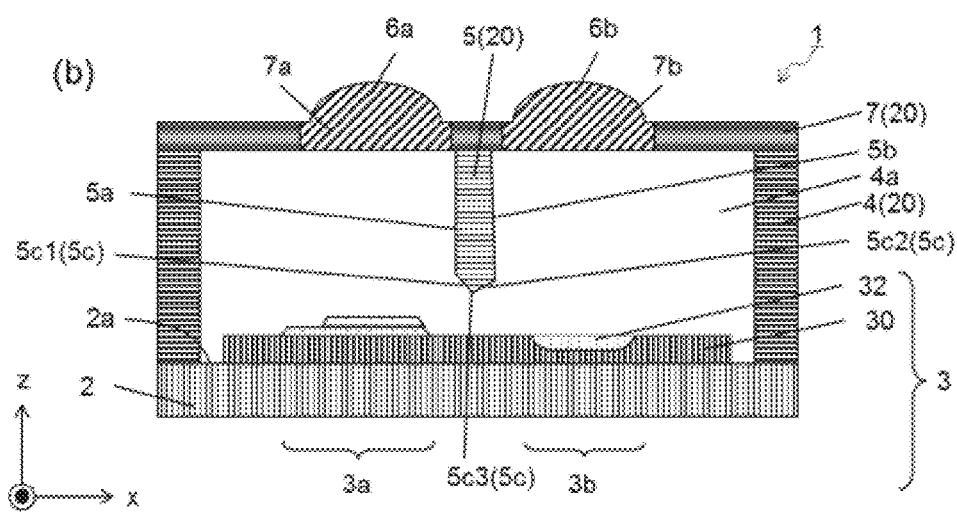

A light-emitting-and-receiving element module 1 in FIGS. 1(*a*) and 1(*b*) is installed in, for example, an image forming apparatus, such as a copying machine and a printer, and functions as part of a sensor device that detects, for example, position information, distance information, surface state, and density information about an illumination object, such as toner and media. A detection object of the light-emitting-and-receiving element module 1 according to the embodiment is not limited to, for example, toner and media. The detection object may be, for example, a metal surface, a tablet surface, or the skin of a living being.

The light-emitting-and-receiving element module 1 includes a light-emitting-and-receiving element array 3 and a housing 20. The light-emitting-and-receiving element array 3 includes a substrate 2, and a plurality of light-emitting elements 3*a* and a plurality of light-receiving elements 3*b* on a top surface 2*a* of the substrate 2. A light-emitting element array includes the plurality of light-emitting elements 3*a*. A light-receiving element array includes the plurality of light-receiving elements 3*b*. In the embodiment, a disposition direction of the light-emitting elements 3*a* and a disposition direction of the light-receiving elements 3*b* are substantially parallel to each other. The light-emitting element array and the light-receiving element array are disposed side by side and apart from each other in a direction orthogonal to these disposition directions.

The housing 20 defines an accommodation space 4*a* in which the light-emitting elements 3*a* and the light-receiving elements 3*b* are accommodated. In the embodiment, the housing 20 includes a frame-shaped outer wall 4, an intermediate wall 5, and a top wall 7. The outer wall 4 surrounds the plurality of light-emitting elements 3a and the plurality of light-receiving elements 3b. The intermediate wall 5 is positioned at an inner side of the outer wall 4, and is positioned between a space for the light-emitting elements 3a and a space for the light-receiving elements 3b in the internal space 4a in the outer wall 4. The top wall 7 covers the substrate 2 and the light-emitting-and-receiving element array 3 and supports a light-emitting-element-side first lens 6a corresponding to the light-emitting element 3a and a light-receiving-element-side second lens 6b corresponding to the light-receiving elements 3b.

The plurality of light-emitting elements 3a and the plurality of light-receiving elements 3b according to the embodiment are, as the light-emitting-and-receiving element array 3, integrated into a top surface of a semiconductor substrate 30. By virtue of such a structure, it is possible to dispose the light-emitting elements 3a and the light-receiving elements 3b at predetermined positions, so that sensing performance can be increased. In this way, in the embodiment, by disposing the semiconductor substrate 30, at which the light-emitting elements 3a and the light-receiving elements 3b are disposed, on the top surface 2a of the substrate 2, and by disposing the light-emitting elements 3a and the light-receiving elements 3b, the light-emitting elements 3a and the light-receiving elements 3b are disposed on the top surface 2a of the substrate 2.

Although, in the embodiment, the light-emitting-and-receiving element array 3 in which the plurality of light-emitting elements 3a and the plurality of light-receiving elements 3b are integrated into each other is used, the number of light-emitting elements 3a and the number of light-receiving elements 3b may be one, or the light-emitting elements 3a and the light-receiving elements 3b may be separately disposed, or a light-emitting-element array in which the plurality of light-emitting elements 3a is integrated into each other and a light-receiving-element array in which the plurality of light-receiving elements 3b is integrated into each other may be used, or a combination of these may be used.

The substrate 2 is electrically connected to the light-emitting-and-receiving element array 3 and to an external device. The substrate 2 functions as a circuit board for applying a bias to the light-emitting elements 3a and the light-receiving elements 3b in the light-emitting-and-receiving element array 3 and for exchanging electrical signals between the light-emitting-and-receiving element array 3 and the external device.

The semiconductor substrate 30 is made of a semiconductor material of one conductivity type. Although the concentration of impurities of the one conductivity type is not limited to certain concentrations, it is desirable that the semiconductor substrate 30 have a high electrical resistance. In the embodiment, as the semiconductor substrate 30, a silicon (Si) substrate containing phosphorous (P) as an impurity of the one conductivity type with a concentration of $1 \times 10^{17} \sim 2 \times 10^{17}$ atoms/cm$^3$ is used. That is, as the semiconductor substrate 30 according to the embodiment, an n-type silicon (Si) substrate is used. Examples of n-type impurities include, in addition to phosphorous (P), nitrogen (N), arsenic (As), antimony (Sb), and bismuth (Bi). The doping concentration is $1 \times 10^{16} \sim 1 \times 10^{20}$ atoms/cm$^3$. In this description, an n-type corresponds to the one conductivity type, and a p-type corresponds to a reverse conductivity type.

The plurality of light-emitting elements 3a is disposed in a column on the top surface of the semiconductor substrate 30, and the plurality of light-receiving elements 3b is disposed along the column of the plurality of light-emitting elements 3a on the top surface of the semiconductor substrate 30. The light-emitting elements 3a function as a light source that applies light to an illumination object. Light emitted from the light-emitting elements 3a is reflected by the illumination object and is incident upon the light-receiving elements 3b. The light-receiving elements 3b function as a light detecting section that detects the incident light.

Figure 2:
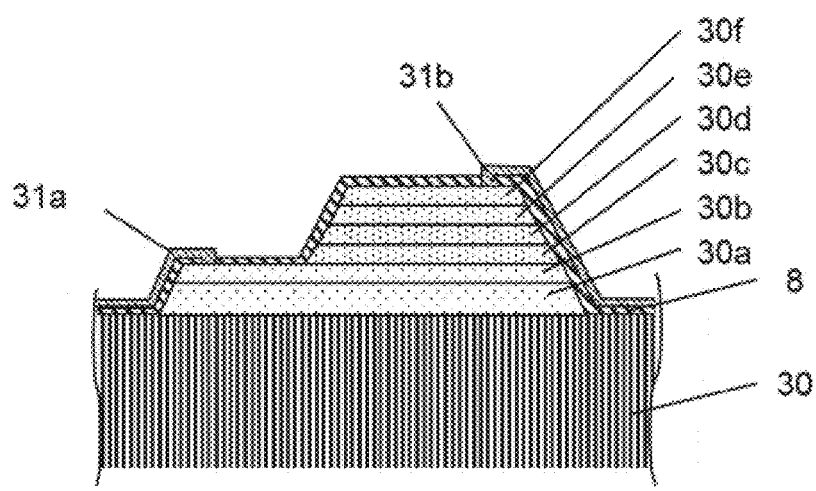
FIG. 2(*a*) is a sectional view of a light-emitting element of the light-emitting-and-receiving element module in FIG. 1.
Figure 2:
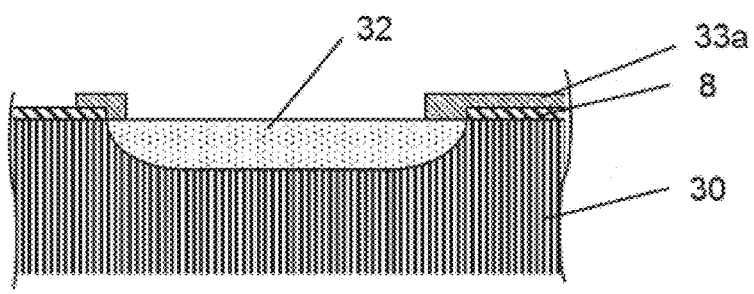

As shown in FIG. 2(a), each light-emitting element 3a includes a plurality of semiconductor layers stacked on the top surface of the semiconductor substrate 30.

First, a buffer layer 30a that reduces the difference between the lattice constant of the semiconductor substrate 30 and the lattice constant of the semiconductor layer (in the embodiment, an n-type contact layer 30b described later) stacked on the top surface of the semiconductor substrate 30. The buffer layer 30a has the function of, by reducing the difference between the lattice constant of the semiconductor substrate 30 and the lattice constant of the semiconductor layer on the top surface of the semiconductor substrate 30, reducing a lattice defect, such as a lattice strain, occurring between the semiconductor substrate 30 and the semiconductor layer, and, thus, reducing a lattice defect or a crystal defect of the entire semiconductor layer on the top surface of the semiconductor substrate 30.

The buffer layer 30a according to the embodiment is made of gallium arsenide (GaAs) that does not contain impurities, and has a thickness of approximately 2 to 3 μm. When the difference between the lattice constant of the semiconductor substrate 30 and the lattice constant of the semiconductor layer stacked on the top surface of the semiconductor substrate 30 is not large, it is possible not to use the buffer layer 30a.

The n-type contact layer 30b is disposed on a top surface of the buffer layer 30a. The n-type contact layer 30b is made of gallium arsenide (GaAs) doped with, for example, silicon (Si) or selenium (Se), which are n-type impurities. The doping concentration of the n-type impurities is, for example, approximately $1 \times 10^{16} \sim 1 \times 10^{20}$ atoms/cm$^3$. The n-type contact layer 30b has a thickness of, for example, approximately 0.8 to 1 μm. In the embodiment, as an n-type impurity, silicon (Si) is doped into the n-type contact layer 30b with a doping concentration of $1 \times 10^{18} \sim 2 \times 10^{18}$ atoms/cm$^3$.

Part of a top surface of the n-type contact layer 30b is exposed. A light-emitting-element first electrode 31a is disposed on the exposed portion. In addition, each light-emitting element 3a is electrically connected to the substrate 2 through the corresponding first electrode 31a by, for example, wire bonding or flip chip connection. The n-type contact layer 30b has the function of reducing contact resistance between it and the first electrode 31a connected to the n-type contact layer 30b.

The first electrode 31a is made of, for example, a gold (Au)-antimony (Sb) alloy, or a gold (Au)-germanium (Ge) alloy, or an Ni-based alloy. The first electrode 31a has a thickness of approximately 0.5 to 5 μm. The first electrode 31a is disposed on an insulating layer 8 that covers the top surface of the n-type contact layer 30b from the top surface of the semiconductor substrate 30. Therefore, the first electrode 31a is electrically insulated from the semiconductor substrate 30 and semiconductor layers other than the n-type contact layer 30b.

The insulating layer 8 is made of, for example, an inorganic insulating material, such as silicon nitride ($SiN_x$) or silicon oxide ($SiO_2$), or an organic insulating material, such as polyimide. The insulating layer 8 has a thickness of, for example, approximately 0.1 to 1 µm.

An n-type clad layer 30c is disposed on the top surface of the n-type contact layer 30b. The n-type clad layer 30c has the function of trapping holes in an active layer 30d described later. The n-type clad layer 30c is made of aluminum gallium arsenide (AlGaAs) doped with, for example, silicon (Si) or selenium (Se), which are n-type impurities. The doping concentration of the n-type impurities is, for example, approximately $1\times10^{16}$~$1\times10^{20}$ atoms/cm$^3$. The n-type clad layer 30c has a thickness of, for example, approximately 0.2 to 0.5 µm. In the embodiment, as an n-type impurity, silicon (Si) is doped into the n-type clad layer 30c with a doping concentration of $1\times10^{17}$~$5\times10^{17}$ atoms/cm$^3$.

The active layer 30d is disposed on a top surface of the n-type clad layer 30c. The active layer 30d functions as a light-emitting layer that emits light as a result of concentration of carriers, such as electrons and holes, and recombination thereof. The active layer 30d is made of aluminum gallium arsenide (AlGaAs) that does not contain an impurity. The active layer 30d has a thickness of, for example, approximately 0.1 to 0.5 µm. Although the active layer 30d according to the embodiment is a layer that does not contain an impurity, the active layer 30d may be a p-type active layer containing a p-type impurity, or an n-type active layer containing an n-type impurity. A band gap of the active layer only needs to be smaller than a band gap of the n-type clad layer 30c and that of a p-type clad layer 30e described later.

The p-type clad layer 30e is disposed on a top surface of the active layer 30d. The p-type clad layer 30e has the function of trapping electrons in the active layer 30d. The p-type clad layer 30e is made of aluminum gallium arsenide (AlGaAs) doped with, for example, zinc (Zn), magnesium (Mg), or carbon (C), which are p-type impurities. The doping concentration of the p-type impurities is, for example, approximately $1\times10^{16}$~$1\times10^{20}$ atoms/cm$^3$. The p-type clad layer 30e has a thickness of, for example, approximately 0.2 to 0.5 µm. In the embodiment, as a p-type impurity, magnesium (Mg) is doped into the p-type clad layer 30e with a doping concentration of $1\times10^{19}$~$5\times10^{20}$ atoms/cm$^3$.

A p-type contact layer 30f is disposed on a top surface of the p-type clad layer 30e. The p-type contact layer 30f is made of aluminum gallium arsenide (AlGaAs) doped with, for example, zinc (Zn), magnesium (Mg), or carbon (C), which are p-type impurities. The doping concentration of the p-type impurities is, for example, approximately $1\times10^{16}$~$1\times10^{20}$ atoms/cm$^3$. The p-type contact layer 30f has a thickness of, for example, approximately 0.2 to 0.5 µm.

A light-emitting-element second electrode 31b is disposed on a top surface of the p-type contact layer 30f. In addition, each light-emitting element 3a is electrically connected to the substrate 2 through the corresponding second electrode 31b by, for example, wire bonding or flip chip connection. The p-type contact layer 30f has the function of reducing contact resistance between it and the second electrode 31b connected to the p-type contact layer 30f.

If a first electrode 31a is disposed as an individual electrode for each light-emitting element, a second electrode 31b need not be disposed for each light-emitting element, so that at least one common second electrode 31b may be disposed. Naturally, a first electrode 31a may be disposed as a common electrode, and a second electrode 31b may be disposed as an individual electrode for each light-emitting element.

A cap layer having the function of preventing oxidation of the p-type contact layer 30f may be disposed on the top surface of the p-type contact layer 30f. The cap layer is made of, for example, gallium arsenide (GaAs) that does not contain an impurity. The cap layer has a thickness of, for example, approximately 0.01 to 0.03 µm.

The second electrode 31b is made of, for example, an AuNi alloy, an AuCr alloy, an AuTi alloy, or an AlCr alloy, which are a combination of gold (Au) or aluminum (Al) and nickel (Ni), chromium (Cr), or titanium (Ti), which are adhesion layers. The second electrode 31b has a thickness of, for example, approximately 0.5 to 5 µm. The second electrode 31b is disposed on the insulating layer 8 that covers the top surface of the p-type contact layer 30f from the top surface of the semiconductor substrate 30. Therefore, the second electrode 31b is electrically insulated from the semiconductor substrate 30 and the semiconductor layers other than the p-type contact layer 30f.

Each light-emitting element 3a having such a structure functions as a light source by applying a bias to between the first electrode 31a and the second electrode 31b and the active layer 30d is caused to emit light.

As shown in FIG. 2(b), each light-receiving element 3b includes a pn joint between the n-type semiconductor substrate 30 and a p-type semiconductor region 32 at a surface layer at the top surface of the semiconductor substrate 30. In the p-type semiconductor region 32, a p-type impurity is diffused with a high concentration in the semiconductor substrate 30. Examples of the p-type impurity include zinc (Zn), magnesium (Mg), carbon (C), boron (B), indium (In), and selenium (Se). The doping concentration of the p-type impurities is, for example, $1\times10^{16}$~$1\times10^{20}$ atoms/cm$^3$. In the embodiment, in order for the p-type semiconductor region 32 to have a thickness of approximately 0.5 to 3 µm, boron (B) is diffused as the p-type impurity.

The p-type semiconductor region 32 is electrically connected to a light-receiving-element third electrode 33a. A light-receiving-element fourth electrode 33b (not shown) is electrically connected to the semiconductor substrate 30, which is an n-type semiconductor. The fourth electrode 33b may be disposed at a location on the top surface of the semiconductor substrate 30 that is separated from the p-type semiconductor region 32 or a bottom surface of the semiconductor substrate 30.

Since the third electrode 33a is disposed on the top surface of the semiconductor substrate 30 with the insulating layer 8 interposed therebetween, the third electrode 33a is electrically insulated from the semiconductor substrate 30. The third electrode 33a surrounds the p-type semiconductor region 32.

The third electrode 33a and the fourth electrode 33b are made of, for example, a gold (Au)-chromium (Cr) alloy, an aluminum (Al)-chromium (Cr) alloy, or a platinum (Pt)-titanium (Ti) alloy. The third electrode 33a and the fourth electrode 33b have a thickness of, for example, approximately 0.5 to 5 µm.

Each light-receiving element 3b having such a structure functions as a light-detecting section by, when light is incident upon the p-type semiconductor region 32, generating a photoelectric current by the photoelectric effect, and taking out the photoelectric current through the third electrode 33a. It is desirable to apply a reverse bias to a portion between the third electrode 33a and the fourth electrode 33b because the optical detection sensitivity of the light-receiving elements 3b is increased.

The outer wall 4 is connected to the top surface of the substrate 2 with an adhesive 9 (not shown) and surrounds the light-emitting-and-receiving element array 3. The outer wall 4 has the function of preventing light emitted from the light-emitting elements 3a from being scattered in directions other than a direction towards an illumination object, the function of preventing light other than light reflected by the illumination object from being incident upon the light-receiving elements 3b, and the function of protecting the substrate 2 and the light-emitting-and-receiving element array 3 from external environment.

The outer wall 4 may be made of a material having low translucency with respect to light emitted from the light-emitting elements 3a. Examples of such a material include general-purpose plastics, such as polypropylene (PP) resin, polystyrene (PS) resin, polyvinyl chloride (PVC) resin, polyethylene-terephthalate (PET) resin, acrylonitrile-butadiene-styrene (ABS) resin; engineering plastics, such as polyamide (PA) resin and polycarbonate (PC) resin; super engineering plastics, such as liquid crystal polymer; and metal materials, such as aluminum (Al) and titanium (Ti).

Although the depth and width of the outer wall 4 according to the embodiment are the same as the depth and width of the substrate 2, the depth and width of the outer wall 4 need not necessarily be the same as the depth and width of the substrate 2. The depth and width of the outer wall only need to be those that allow the light-emitting elements 3a and the light-receiving elements 3b to be covered.

The intermediate wall 5 is disposed between a region where the light-emitting elements 3a are disposed and a region where the light-receiving elements 3b are disposed in the accommodation space 4a defined by inner sides of the outer wall 4. That is, the light-emitting elements 3a are positioned on one side of the intermediate wall 5, and the light-receiving elements 3b are positioned on the other side of the intermediate wall 5.

The intermediate wall 5 has the function of reducing light emitted from the light-emitting elements 3a to be incident upon the light-receiving elements 3b without being reflected by an illumination object.

The intermediate wall 5 does not contact the light-emitting-and-receiving element array 3 and the substrate 2. More specifically, the intermediate wall 5 is apart from the top surface 2a of the substrate 2 at a location above the substrate 2. When the intermediate wall 5 is disposed in this way, even if the intermediate wall 5 is stretched in response to thermal expansion when the light-emitting-and-receiving element module 1 is driven and generates heat or receives heat from an external environment, since the intermediate wall 5 does not contact the substrate 2 and the light-emitting-and-receiving element array 3 including the light-emitting elements 3a and the light-receiving elements 3b, it is possible to maintain the positional relationship between the light-emitting elements 3a and the light-receiving elements. Therefore, sensing performance can be increased.

The intermediate wall 5 includes a first side wall 5a that faces the light-emitting elements 3a, a second side surface 5b that faces the light-receiving elements 3b, and a lower surface 5c that is connected to the first side surface 5a and the second side surface 5b. The lower surface 5c of the intermediate wall 5 faces the top surface 2a of the substrate 2, and is apart from the top surface 2a of the substrate 2.

The first side surface 5a and the second side surface 5b according to the embodiment are disposed along a normal line to a top surface of the light-emitting-and-receiving element array 3 and along the disposition direction of the light-emitting elements 3a and the disposition direction of the light-receiving elements 3b. The first side surface 5a and the second side surface 5b according to the embodiment contact the outer wall 4. More specifically, the first side surface 5a and the second side surface 5b extend from one principal surface of inner surfaces of the outer wall 4 towards the other principal surface, opposing the one principal surface, of the inner surfaces of the outer wall 4, and are connected to the one principal surface and the other principal surface of the outer wall 4.

The first side surface 5a and the second side surface 5b according to the embodiment need not necessarily contact the outer wall 4, and may have any shape as long as the internal space 4a in the outer wall 4 is capable of being divided into the space for the light-emitting elements 3a and the space for the light-receiving elements 3b. However, the length of the light-emitting elements 3a and the light-receiving elements 3b in the disposition directions needs to be at least greater than or equal to the length of the column of the light-emitting elements 3a.

The lower surface 5c of the intermediate wall 5 has a protruding shape. That is, the lower surface 5c of the intermediate wall 5 has a protruding shape in a section formed by cutting the light-emitting elements 3a, the light-receiving elements 3b, and the intermediate wall 5 in an up-down direction (Z-axis direction). As a result, it is possible to reduce that light from the light-emitting elements 3a is reflected at the lower surface 5c of the intermediate wall 5 and is striking of the light upon the light-receiving elements 3b.

That is, exiting light from the light-emitting elements 3a propagates while spreading upward. Compared to when the lower surface 5c is substantially parallel to an XY plane, a part of the exiting light being incident upon the lower surface 5c on the light-emitting elements 3a side from an apex portion of the lower surface 5c can be reflected towards the light-emitting elements 3a. In addition, a part of the exiting light travelling in straight lines towards a region on the light-receiving elements 3b side from the apex portion of the lower surface 5c of the intermediate wall 5 can be reduced from easily being incident upon the lower surface 5c of the intermediate wall 5. Therefore, it is possible to reduce that a part of the light from the light-emitting elements 3a is reflected at the lower surface 5c and arrives to the light-receiving elements 3b.

In other words, the intermediate wall 5 makes it possible to reduce the amount of light that is incident upon the light-receiving elements 3b as stray light as a result of dividing the light into at least three types in accordance with the exiting angle of the light in a direction Z, that is, light that reaches the first lens 6a from the light-emitting elements 3a, light that is reflected by an inclined surface 5c1 and is reflected to a region where the light-receiving elements 3b are not disposed, and light that is guided by a second inclined surface 5c2 to escape to the other side of the intermediate wall 5. Therefore, the light-emitting-and-receiving element module 1 is capable of having high sensing performance with the influence of stray light being reduced.

The "XY plane" is defined as a plane parallel to the top surface 2a of the substrate 2, and the direction in which the XY plane extends through the light-emitting elements 3a and the light-receiving elements 3b is defined as a direction X.

More specifically, the lower surface 5c according to the embodiment faces the top surface 2a of the substrate 2, and includes the first inclined surface 5c1 disposed continuously from the first side surface 5a and the second inclined surface 5c2 disposed continuously from the first inclined surface 5c1 to the second side surface 5b. Since the first side surface 5a and the second side surface 5b according to the embodiment are connected to the one principal surface and the other principal surface of the outer wall 4, the lower surface 5c of the intermediate wall 5 is disposed continuously from the one principal surface towards the other principal surface of the outer wall 4. In other words, the shape of the lower surface 5c of the intermediate wall 5 is a triangular prism shape, and the base of the triangular prism shape is connected to the one principal surface and the other principal surface of the outer wall 4.

In the lower surface 5c according to the embodiment, the lower surface 5c on the light-emitting elements 3a side from the apex portion of the lower surface 5c is the first inclined surface 5c1, and the lower surface 5c on the light-receiving elements 3b from the apex portion of the lower surface 5c" is the second inclined surface 5c2. A portion that is an apex where the first inclined surface 5c1 and the second inclined surface 5c2 intersect is an intersection point 5c3.

The first inclined surface 5c1 is inclined in such a manner that the length of a vertical line extending from the first inclined surface 5c1 to the top surface 2a becomes longer with decreasing distance to the light-emitting elements 3a in the direction X from the intersection point 5c3. Similarly, the second inclined surface 5c2 is inclined in such a manner that the length of a vertical line extending from the second inclined surface 5c2 to the top surface 2a becomes longer with decreasing distance to the light-receiving elements 3b in the direction X from the intersection point 5c3. In other words, the first inclined surface 5c1 is inclined in such a manner that its distance from the light-emitting elements 3a in the direction Z is increased with decreasing distance from the light-emitting elements 3a in the direction X. Similarly, the second inclined surface 5c2 is inclined in such a manner that its distance from the light-receiving elements 3b in the direction Z is increased with decreasing distance from the light-receiving elements 3b in the direction X.

The "direction Z" refers to a thickness direction, which is a direction perpendicular to the top surface 2a.

As described above, when the lower surface 5c includes two such inclined surfaces (5c1, 5c2), even if light emitted from the light-emitting elements 3a is incident upon the lower surface 5c, it is possible to reduce leakage of the light as stray light towards the light-receiving elements 3b.

The second inclined surface 5c2 allows light, which has a large angle with respect to the direction Z, of exiting light from the light-emitting elements 3a to escape to an opposite side of the intermediate wall 5. This makes it possible to reduce that a part of the light from the light-emitting elements 3a is reflected at the lower surface 5c and arrives of the light to the light-receiving elements 3b.

Compared to when the lower surface 5c includes an inclined surface that is inclined in one direction in its entirety, when the lower surface 5c includes the two inclined surfaces (5c1, 5c2) that are inclined in different directions, its size in the direction Z required to reduce stray light can be reduced, as a result of which the height of the light-emitting-and-receiving element module 1 is reduced.

Compared to when the lower surface 5c includes an inclined surface that is inclined in one direction in its entirety, when the lower surface 5c includes the two inclined surfaces (5c1, 5c2), the thickness of the intermediate wall 5 can be increased while the size in the direction Z is kept the same. As a result, it is possible to increase light-intercepting performance of the intermediate wall 5.

Figure 3:
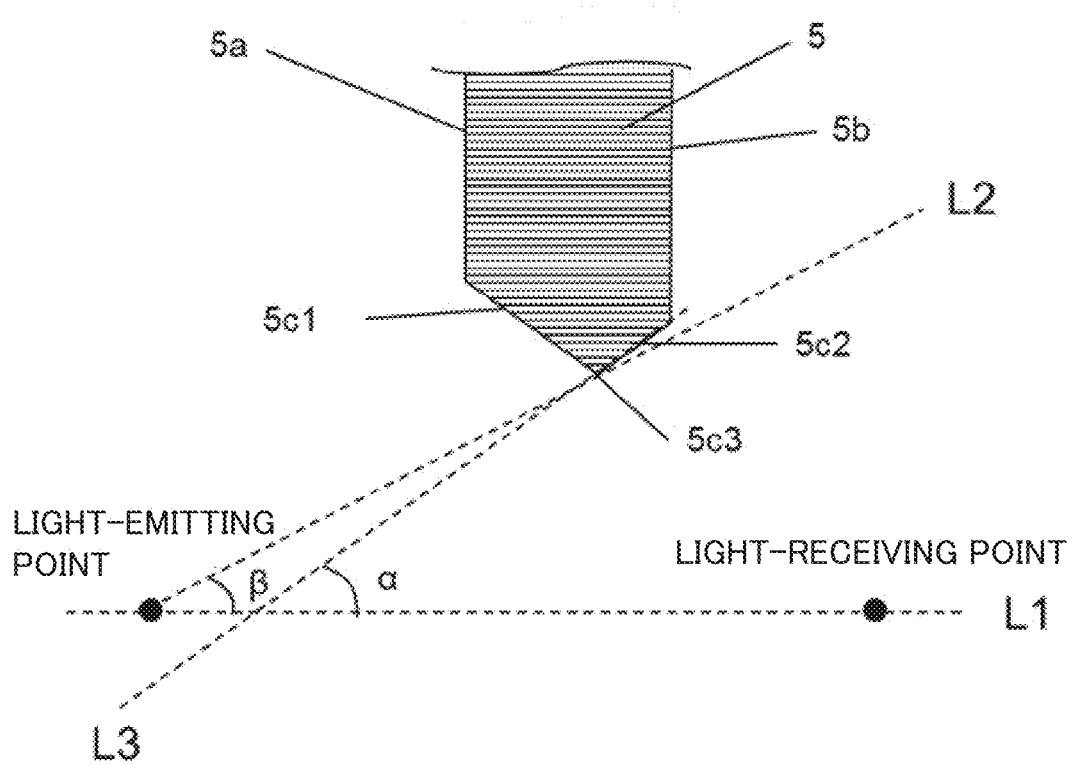
FIG. 3 is a schematic view illustrating a location of a light-intercepting wall and inclined surfaces.

Such an intermediate wall 5 may be positioned above an imaginary line connecting a light-emitting point of the light-emitting elements 3a and the apex of the lower surface 5c. More specifically, as in the example in FIG. 3, an inclination angle α of the second inclined surface 5c of the intermediate wall 5 may be large. That is, when a line extending through any light-emitting point of the light-emitting elements 3a and any light-receiving point of the light-receiving elements 3b is a first imaginary straight line L1, a line extending through the light-emitting point and the intersection point 5c3 is a second imaginary straight line L2, and an extension line of the second inclined surface 5c2 is a third imaginary straight line L3, the angle α of the second inclined surface 5c2 is an angle between L1 and L3. The angle α is larger than an angle β between L1 and L2.

When the angle α is larger than the angle β, the second inclined surface 5c2 allows light, which has a large angle with respect to the direction Z, of exiting light from the light-emitting elements 3a to escape upward in the direction Z to an opposite side of the intermediate wall 5 without colliding with the intermediate wall 5. This makes it possible to reduce that a part of the light from the light-emitting elements 3a is reflected at the lower surface 5c and arrives of the light to the light-receiving elements 3b.

Since each light-emitting element 3a emits light by its active layer 30d, the term "light-emitting point" refers to any point on the active layer 30d. Since each light-receiving element 3b receives light at a surface of its semiconductor region 32, the term "light-receiving point" refers to any point on the surface of the semiconductor region 32.

The arithmetic average roughness of the first inclined surface 5c1 may be greater than the arithmetic average roughness of the first side surface 5a. This makes it possible for light traveling towards the first lens 6a to reach the first lens 6a without shifting from its actual direction of propagation, and light reaching the first inclined surface 5c1 is scattered, so that stray light can be reduced.

In order to increase the arithmetic average roughness of the first inclined surface 5c1, the first inclined surface 5c1 may be made mechanically rough, or may be made physically rough by applying, for example, plasma.

Figure 7:
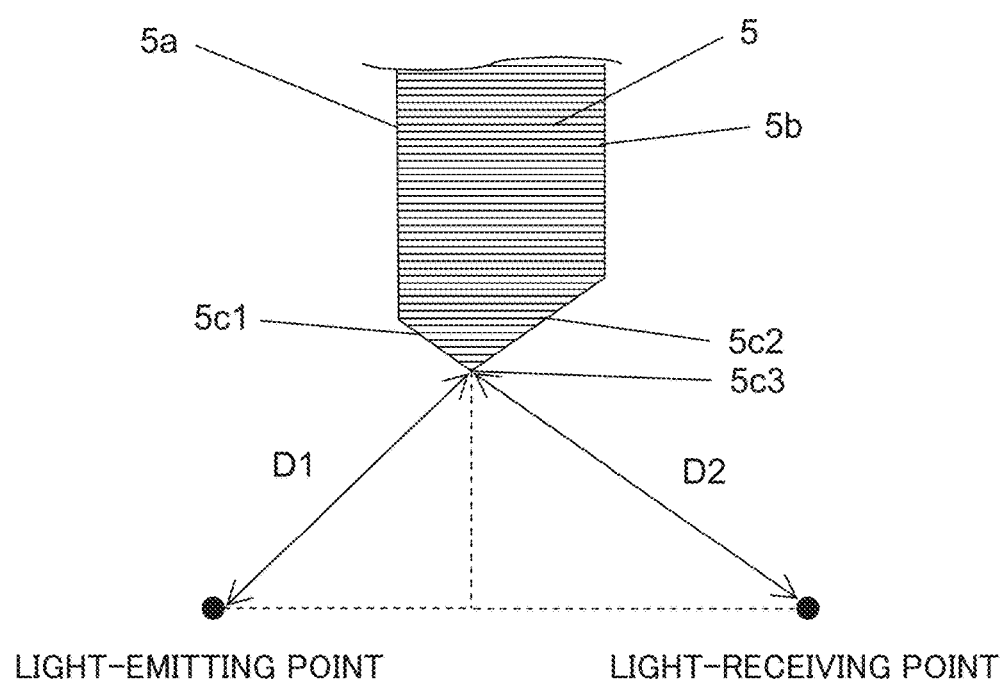
FIG. 7 is an enlarged sectional view of a main portion of a modification of the light-emitting-and-receiving element modules in FIGS. 1 and 6.
Figure 7:
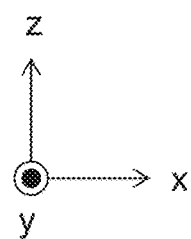

A distance D1 between the apex of the lower surface 5c of the intermediate wall 5 and a light-emitting point of the light-emitting elements 3a may be less than a distance D2 between the apex of the lower surface 5c of the intermediate wall 5 and a light-receiving point of the light-receiving elements 3b. That is, as in FIG. 7, the apex of the lower surface 5c of the intermediate wall 5 may be positioned close to the light-emitting elements 3a. As a result, it is possible to move the apex of the lower surface 5c away from the light-receiving elements 3b, and reduce striking of the light against the light-receiving elements 3b after a light from the light-emitting elements 3a diffusely reflects at the apex portion of the lower surface 5c of the intermediate wall 5. Broken lines in FIG. 7 are auxiliary lines for indicating D1 and D2.

The first inclined surface 5c1 may be a combination of two or more inclined surfaces if the inclined surfaces incline in the same direction. Here, the inclined surface that is connected to the light-emitting-element-side surface 5a may have an inclination angle that is larger than that of the inclined surface that is connected to the intersection point 5c3. This also similarly applies to the second inclined surface 5c2.

A portion of the first inclined surface 5c1 that is connected to the light-emitting-element-side surface 5a or a portion of the first inclined surface 5c1 that is connected to the intersection point 5c3 may have varying inclination angles or may be partly curved. This also similarly applies to the second inclined surface 5c2.

Although the lower surface 5c according to the embodiment includes the inclined surfaces 5c1 and 5c2, the lower surface 5c may have a concave portion in part of a protruding portion instead of the inclined surfaces.

Similarly to the outer wall 4, such an intermediate wall 5 may be made of, for example, general-purpose plastics, such as polypropylene (PP) resin, polystyrene (PS) resin, polyvinyl chloride (PVC) resin, polyethylene-terephthalate (PET) resin, acrylonitrile-butadiene-styrene (ABS) resin; engineering plastics, such as polyamide (PA) resin and polycarbonate (PC) resin; super engineering plastics, such as liquid crystal polymer; and metal materials, such as aluminum (Al) and titanium (Ti).

The top wall 7 covers the substrate 2 and the light-emitting-and-receiving element array 3. The top wall 7 according to the embodiment contacts a top end of the outer wall 4. The top wall 7 includes a through hole 7a that is positioned in correspondence with the light-emitting elements 3a and a through hole 7b that is positioned in correspondence with the light-receiving elements 3b. The through hole 7a and the through hole 7b take out light from the light-emitting elements 3a to the outside towards an illumination object and guide light reflected from the illumination object to the light-receiving elements 3b, respectively; and serve as supports of the lenses 6a and 6b described later.

Here, the intermediate wall 5 is disposed between the through holes 7a and 7b.

Similarly to the outer wall 4 and the intermediate wall 5, the top wall 7 is made of, for example, general-purpose plastics, such as polypropylene (PP) resin, polystyrene (PS) resin, polyvinyl chloride (PVC) resin, polyethylene-terephthalate (PET) resin, acrylonitrile-butadiene-styrene (ABS) resin; engineering plastics, such as polyamide (PA) resin and polycarbonate (PC) resin; super engineering plastics, such as liquid crystal polymer; and metal materials, such as aluminum (Al) and titanium (Ti).

The outer wall 4, the intermediate wall 5, and the top wall 7 according to this application are integrated into each other by injection molding of polycarbonate (PC) resin.

The first lens 6a and the second lens 6b are disposed in the through hole 7a and the through hole 7b in the top wall 7, respectively; and function to gather light emitted from the light-emitting elements 3a and function to gather light reflected by an illumination object, respectively. When the light-emitting-and-receiving element module 1 includes the first lens 6a and the second lens 6b, even if the distance between the light-emitting-and-receiving element module 1 and the illumination object is large, it is possible to increase sensing performance.

The first lens 6a and the second lens 6b are made of, for example, plastics such as thermosetting resin (for example, silicone resin, urethane resin, and epoxy resin) or thermoplastic resin (for example, polycarbonate resin and acrylic resin); sapphire; or inorganic glass.

The first lens 6a and the second lens 6b according to the embodiment are cylindrical lenses made of silicone resin, and have curvatures in longitudinal directions of the through holes 7a and 7b, that is, a direction orthogonal to the direction along the column of light-emitting elements 3a and in a direction orthogonal to the direction along the column of light-receiving elements 3b, respectively, in the light-emitting-and-receiving element array 3. The first lens 6a and the second lens 6b are mounted on the top wall 7 by using, for example, an organic adhesive, such as silicone resin.

In the embodiment, a straight line connecting centers of light-emitting portions of the light-emitting elements 3a and a straight line connecting centers of light-receiving portions of the light-receiving elements 3b and an optical axis of the first lens 6a and an optical axis of the second lens 6b substantially coincide with each other; and the optical axes substantially coincide with a direction of a normal line extending upward from a top surface of the light-emitting-and-receiving element array 3. By virtue of such a structure, it becomes possible to apply light emitted from the light-emitting elements 3a to an illumination object with high illuminance, and to increase the illuminance when the light emitted from the light-emitting elements 3a is reflected by the illumination object and is received by the light-receiving elements 3b. Therefore, the light-emitting-and-receiving element module 1 is capable of having high sensitivity, that is, high sensing performance.

Here, the term "centers of light-receiving portions" refers to the centers of the p-type semiconductor regions 32 when the semiconductor substrate 30 is seen in plan view from the p-type semiconductor regions 32a. Similarly, the term "centers of light-emitting portions" refers to the centers of the active layers 30d when the semiconductor substrate 30 is seen in plan view from the p-type contact layers 30f. Since, for example, each p-type clad layer 30e and each p-type contact layer 30f are stacked on the top surface of the corresponding active layer 30d, the center of the active layer 30d cannot be directly observed, so that the center of the p-type contact layer 30f may be considered as the center of the active layer 30d. This is because, as mentioned above, since each semiconductor layer is very thin, even if etching for forming the light-emitting element array 3a and etching for exposing part of a top surface of each n-type contact layer 30b are performed separately, the center of each p-type contact layer 30f and the center of each active layer 30d substantially coincide with each other when seen in perspective plan view from the corresponding p-type contact layer 30f.

Although the first lens 6a and the second lens 6b according to the embodiment are each a cylindrical lens, the first lens 6a may be a planoconvex lens corresponding to the light-emitting elements 3a and the second lens 6b may be planoconvex lens corresponding to the light-receiving elements 3b.

Although, in the embodiment, the light-emitting-and-receiving element module 1 includes the first lens 6a and the second lens 6b, for example, when the light-emitting-and-receiving element module 1 and an illumination object are set close to each other, the light-emitting-and-receiving element module 1 need not include the first lens 6a and the second lens 6b, and need not necessarily include the top wall 7 either.

(Sensor Device)

Next, a sensor device 100 including the light-emitting-and-receiving element module 1 is described. An example in which the light-emitting-and-receiving element module 1 is applied to a sensor device that detects the position of toner T (illumination object) adhered to an intermediate transfer belt V in an image forming apparatus, such as a copying machine or printer, is described below.

Figure 4:
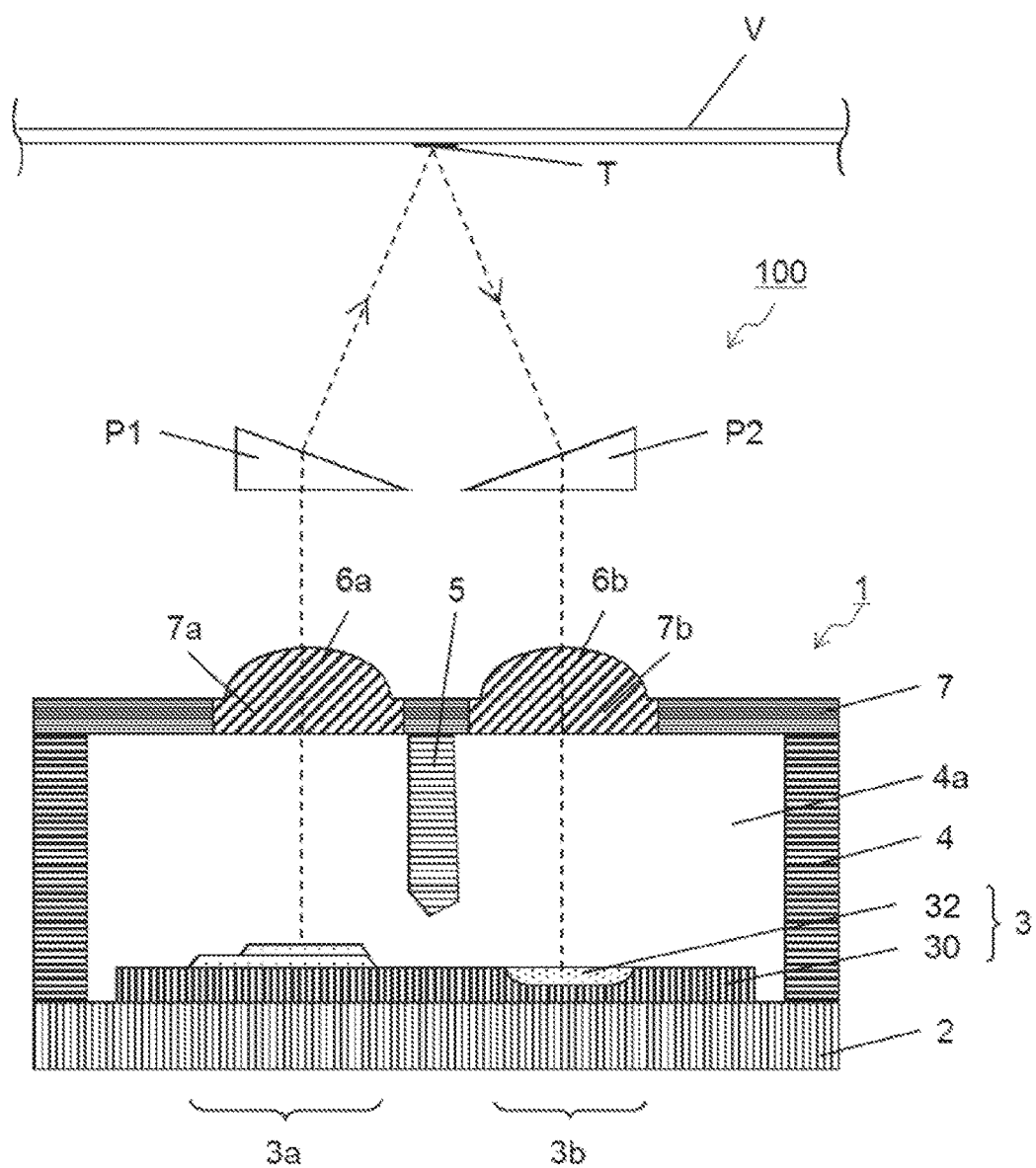
FIG. 4 is a schematic sectional view of a sensor device using the light-emitting-and-receiving element module in FIG. 1 according to an embodiment.

As in FIG. 4, the sensor device 100 according to the embodiment is disposed in such a manner that a surface of the light-emitting-and-receiving element module 1 on which the light-emitting elements 3a and the light-receiving elements 3b are disposed faces the intermediate transfer belt V. The light-emitting elements 3a apply light to the toner T on the intermediate transfer belt V. In the embodiment, a prism P1 is disposed above the light-emitting elements 3a, a prism P2 is disposed above the light-receiving elements 3b, and the light emitted from the light-emitting elements 3a is refracted by the prism P1 through the lens 6a and is incident upon the toner T on the intermediate transfer belt V. Specularly reflected light L2 of incident light L1 is refracted by the prism P2 and is received by the light-receiving elements 3b through the second lens 6b. A photoelectric current is generated at the light-receiving elements 3b in accordance with the intensity of the received light, and is detected by an external device through, for example, the light-receiving-element third electrodes 33a.

The sensor device 100 according to the embodiment is capable of detecting a photoelectric current corresponding to the intensity of specularly reflected light from the toner T as described above. Therefore, for example, when a photoelectric current value that is detected by an nth light-receiving element from one end of the column of light-receiving elements 3b is largest, it is possible to detect the position of the toner T on the intermediate transfer belt V, that is, to detect that the toner T is positioned in correspondence with this nth light-receiving element 3b. Since the intensity of the specularly reflected light also corresponds to the density of the toner T, it is possible to detect the density of the toner T in accordance with the magnitude of the generated photoelectric current. Similarly, since the intensity of the specularly reflected light also corresponds to the distance from the light-emitting-and-receiving element array 3 to the toner T, it is possible to detect the distance between the light-emitting-and-receiving element array 3 and the toner T in accordance with the magnitude of the generated photoelectric current.

The sensor device 100 according to the embodiment is capable of providing the above-described advantages provided by the light-emitting-and-receiving element module 1. (First Modification: Light-Emitting-and-Receiving Element Module 1A)

Figure 5:
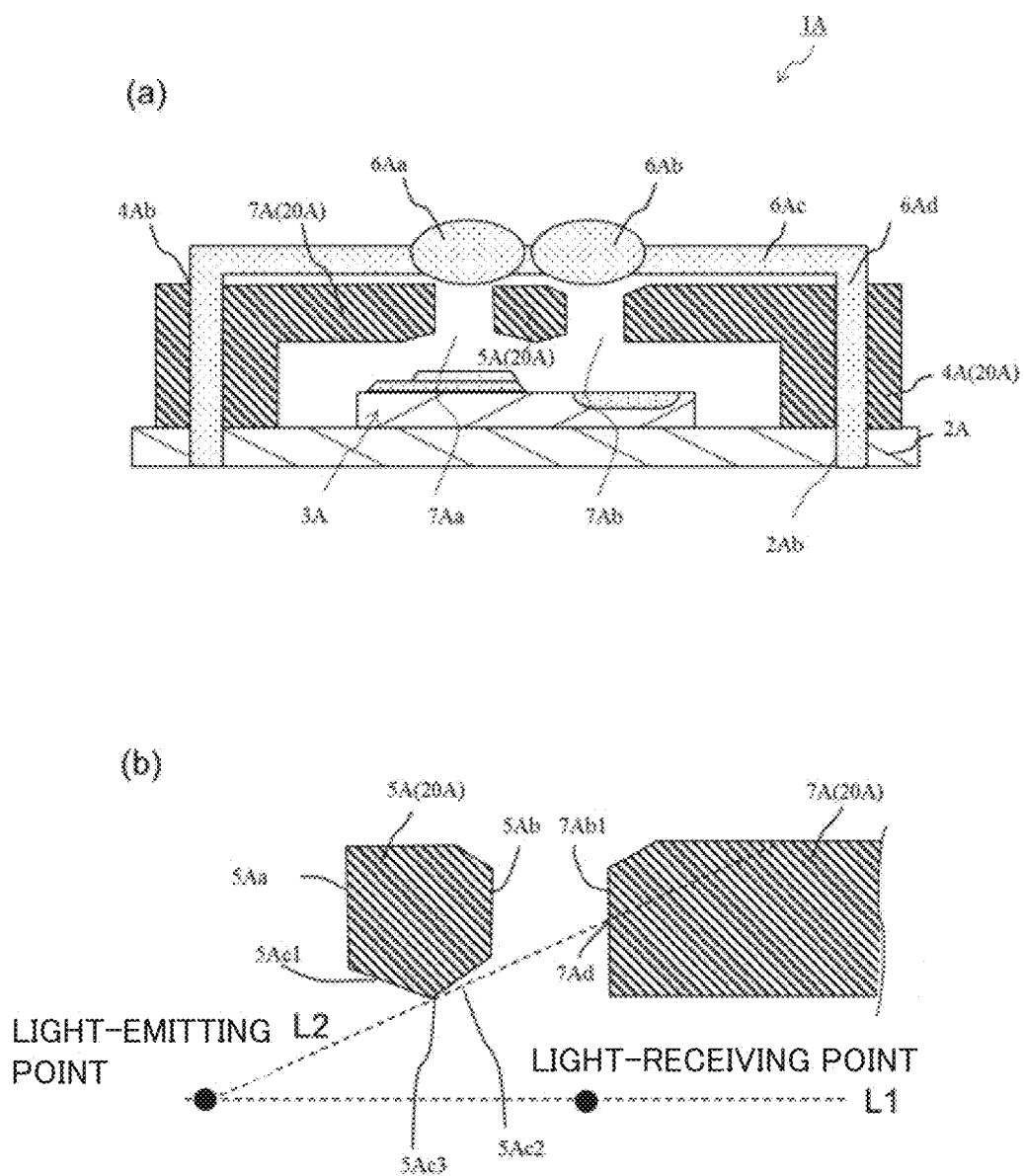
FIG. 5(*a*) and FIG. 5(*b*) are, respectively, a schematic sectional view of a light-emitting-and-receiving element module 1A according to a modification of the light-emitting-and-receiving element module in FIG. 1, and an enlarged view of a main portion of the light-emitting-and-receiving element module 1A.

Although, in the embodiment described above, an example in which the intermediate wall 5 extending downward from the top wall 7 of the housing 20 is used is described, the embodiment is not limited to this example. For example, as in a light-emitting-and-receiving element module 1A in FIG. 5, part of a top wall 7A may function as an intermediate wall 5A.

The light-emitting-and-receiving element module 1A differs from the light-emitting-and-receiving element module 1 in that the light-emitting-and-receiving element module 1A includes a housing 20A and a lens 6A. The other portions are the same. Only the differences are described below.

The housing 20A includes an outer wall 4A and a top wall 7A. The outer wall 4A and the top wall 7A are integrated into each other. The top wall 7A includes a first opening section 7Aa positioned in correspondence with the light-emitting elements 3a, and a second opening section 7Ab positioned in correspondence with the light-receiving elements 3b. The first opening section 7Aa and the second opening section 7Ab serve as an aperture for allowing light from the light-emitting elements 3a to exit to the outside, and as an aperture for guiding reflected light from a non-illumination object to the light-receiving elements 3b, respectively. Therefore, the second opening section 7Ab has a shape whose opening diameter gradually increases upward from a portion of the second opening section 7Ab in a thickness direction.

A region of the top wall 7A between the first opening section 7Aa and the second opening section 7Ab functions as the intermediate wall 5A. That is, a lower surface 5Ac of the intermediate wall 5A does not protrude beyond other portions of a lower surface of the top wall 7A facing the accommodation space 4a.

By virtue of such a structure, it is possible to bring the top wall 7A close to the light-emitting-and-receiving element array 3, so that it is possible to reduce the height of the light-emitting-and-receiving element module 1A. When the apertures are close to the light-emitting elements 3a and the light-receiving elements 3b, it is possible to effectively use light from the light-emitting elements 3a and guide reflected light to the light-receiving elements 3b with good precision. Therefore, the light-emitting-and-receiving element module 1A is capable of having high sensing performance. Further, since the intermediate wall 5A is not a protruding portion, there is no possibility of the intermediate wall 5A contacting and damaging the semiconductor substrate 30. Therefore, the light-emitting-and-receiving element module 1A is capable of being highly reliable.

Of a wall surface defining the second opening section 7Ab, a region 7Ab1 facing a portion that serves as the intermediate wall 5A is not particularly limited to a certain region as along as the region 7Ab1 is not an inclined surface that causes the opening diameter to gradually increase downward in a thickness direction. This is because, when the region 7Ab1 is an inclined surface that causes the opening diameter to gradually increase downward in the thickness direction, light that has travelled towards the other side of the intermediate wall 5A along an imaginary straight line L2 is reflected towards the light-receiving elements 3b (lower side).

Therefore, it is desirable that the region 7Ab1 be an inclined surface that causes the opening diameter to increase upward, or be substantially parallel to the direction Z (perpendicular to a principal surface). In the example, although the region 7Ab1 is an inclined surface that causes the opening diameter to increase upward at an upper portion of the region 7Ab1, an intersection portion 7Ad that intersects the second imaginary straight line L2 is substantially parallel to the direction Z.

This is because, by virtue of such a structure, the second inclined surface 5Ac2, for example, can reflect upward, light that has travelled towards the other side of the intermediate wall 5A along the imaginary straight line L2 and guide the light to the outer side of the accommodation space 4Aa. Further, by virtue of such a structure, the opening diameter can be kept constant, so that it is possible to prevent the second opening section 7Ab from losing its function as an aperture due to the opening diameter at an upper portion of the second opening section 7Ab being too large or the opening diameter at a lower portion of the second opening section 7Ab being too small.

For example, the opening diameters and opening positions of the upper portions of the first opening section 7Aa and the second opening section 7Ab in the top wall 7A need to be strictly controlled due to their relationship with the lens 6A described later. Therefore, when a first inclined surface 5Ac1 and a second inclined surface 5Ac2 are disposed up to the vicinity of an upper portion of the top wall 7A in relation to the thickness, this may influence the functioning of the opening sections as apertures. In addition, when many inclined surfaces are disposed, the strength of the top wall 7A is reduced, and, thus, reliability may be reduced. Therefore, the first inclined surface 5Ac1 and the second inclined surface 5Ac2 are disposed below a halfway point in relation to the thickness of the top wall 7A, and, desirably, at a region that is ¼ or less of the thickness at a lower side.

The lens 6A includes a first lens 6Aa, a second lens 6Ab, and a support 6Ac that are integrated into each other. The support 6Ac has a plate shape, and holds the first lens 6Aa and the second lens 6Ab in a plane of the support 6Ac. At least two downwardly extending columns 6Ad are disposed at corners of the support 6Ac. Here, a substrate 2A and the wide outer wall 4A of the housing 20A include a through hole 2Ab and a through hole 4Ab, respectively. When the columns 6Ad are inserted into the through holes 2Ab and 4Ab, it is possible to dispose the substrate 2A, the housing 20A, and the lens 6A at desired locations by positioning them with one reference.

When such a lens 6A is used, since the lens 6A is small and is disposed with high positional precision, the light-emitting-and-receiving element module 1A is capable of having high sensing performance.

Further, in the light-emitting-and-receiving element modules 1 and 1A, the angle of the first inclined surface 5c1 is set in such a manner that reflected light produced when light from the light-emitting elements 3a is specularly reflected at the intersection point 5c3 of the first inclined surface 5c1 is not incident upon the light-receiving elements 3b.

Figure 6:
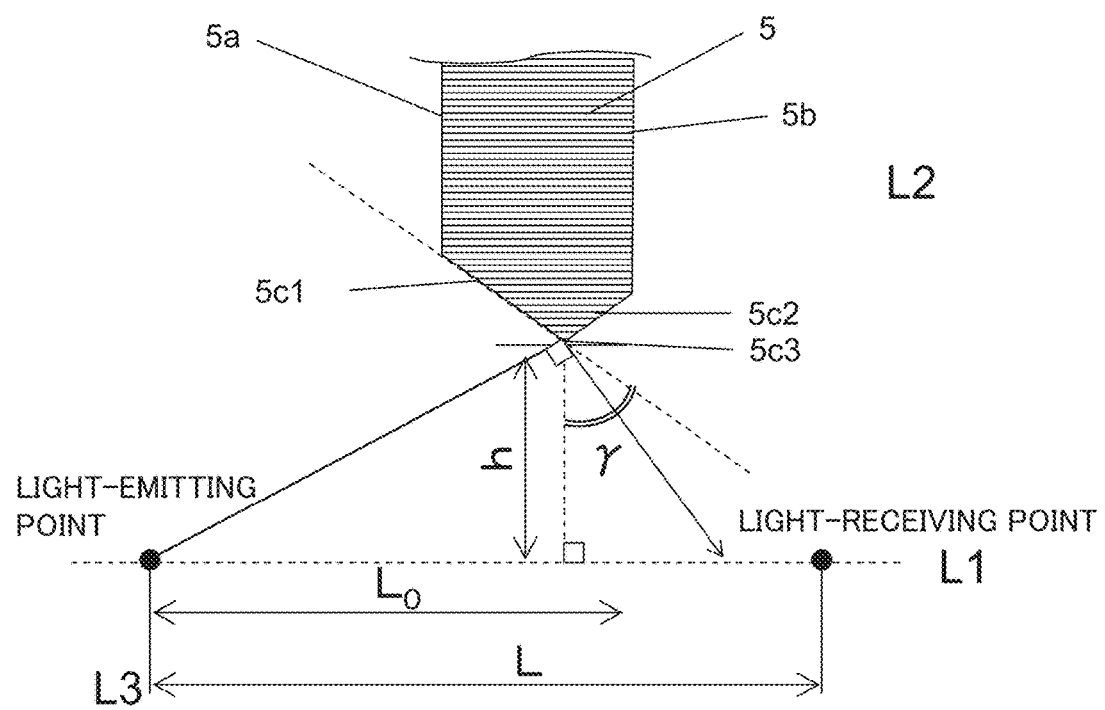
FIG. 6 is an enlarged sectional view of a main portion of a modification of the light-emitting-and-receiving element modules in FIGS. 1 and 5.

More specifically, as in FIG. 6, the angle of the first inclined surface 5c1 is adjusted in such a manner as to satisfy the following expression:

$$L > L_0 + h \times \tan\{2\gamma - \tan^{-1}(h/L_0) - 90\} (h > 0)$$

where the distance between the light-emitting point of the light-emitting elements 3a and the light-receiving point of the light-receiving elements 3b is L, the length of a perpendicular line extending from the intersection point 5c3 to the first imaginary straight line L1 extending through the light-emitting point and the light-receiving point is h, the distance from the light-emitting point to the perpendicular line along the first imaginary straight line is $L_0$, and the angle between the perpendicular line and the first inclined surface 5c1 from the perpendicular line is $\gamma$.

In the light-emitting-and-receiving element modules 1 and 1A, the angle between the first inclined surfaces 5c1 and 5Ac1 and the respective second inclined surfaces 5c2 and 5Ac2 may be obtuse angles. By virtue of such a structure, when molding the intermediate wall 5 out of resin, the resin tends to flow around, so that it is possible to produce the intermediate wall 5 precisely with a desired shape. Since the angles of the inclined surfaces 5c1, 5Ac1, 5c2 and 5Ac2 are such that they are tilted with respect to the top surface of the substrate 2, the length of the intermediate wall 5 in the thickness direction (direction Z) can be made small, so that the height of the light-emitting-and-receiving element module 1 can be reduced. Further, it is possible to prevent the intersection points 5c3 and 5Ac3 from contacting and damaging the semiconductor substrate 30.

(Second Modification)

Although, in the above-described embodiment, an example in which the semiconductor substrate 30 is mounted on the substrate 2 is described, the embodiment is not limited to this example. For example, the semiconductor substrate 30 may be mounted on the substrate 2 with a base, of, for example, a heat-dissipating member, being disposed therebetween. The housing 20 need not be connected to the substrate 2, and may be connected to, for example, the semiconductor substrate 30.

Although a specific embodiment according to the present invention is described above, the present invention is not limited thereto. Various modifications may be made within a range that does not depart from the gist of the present invention.

The invention claimed is:

1. A light-emitting-and-receiving element module comprising:
   a substrate that comprises a top surface;
   a light-emitting element on the top surface of the substrate;
   a light-receiving element on the top surface of the substrate and apart from the light-emitting element; and
   an intermediate wall between the light-emitting element and the light-receiving element, the intermediate wall comprising a lower surface disposed apart from the top surface and above light-emitting portions of the light-emitting element and light-receiving portions of the light-receiving element,
   wherein the lower surface of the intermediate wall has a first inclined surface that faces the light-emitting element, a second inclined surface that faces the light-receiving element, and an intersection point that is an apex where the first inclined surface and the second inclined surface intersect,
   wherein the second inclined surface is positioned above an imaginary line connecting a light-emitting point of the light-emitting element and a lower end of the second inclined surface, and
   when a line extending through the light-emitting point of the light-emitting element and a light-receiving point of the light-receiving element is a first imaginary straight line L1, a line extending through the light-emitting point and the intersection point is a second imaginary straight line L2, and an extension line of the second inclined surface is a third imaginary straight line L3, an angle $\alpha$ of the second inclined surface that is an angle between L1 and L3 is greater than an angle $\beta$ between L1 and L2.

2. The light-emitting-and-receiving element module according to claim 1, wherein the intermediate wall further comprises a first side surface which extends in an up-down direction, which is connected to the lower surface, and which faces the light-emitting element, and
   wherein an arithmetic average roughness of the first inclined surface is greater than an arithmetic average roughness of the first side surface.

3. The light-emitting-and-receiving element module according to claim 1, wherein an inclination angle of the first inclined surface allows reflected light produced when light from the light-emitting element is specularly reflected at an intersection point of the first inclined surface, where the first inclined surface and the second inclined surface intersect each other, to reach a location that is towards the light-emitting element than the light-receiving element.

4. The light-emitting-and-receiving element module according to claim 1, comprising:
   a housing that defines an accommodation space in which the light-emitting element and the light-receiving element are accommodated;
   wherein the housing comprises
     a first opening section that allows light from the light-emitting element to exit to an outside, and
     a second opening section that guides reflected light from the outside to the light-receiving element, and
   wherein the intermediate wall is positioned between the first opening section and the second opening section of the housing.

5. The light-emitting-and-receiving element module according to claim 4, wherein the second opening section is disposed in such a manner that a wall surface of the second opening section and the imaginary line intersect each other.

6. The light-emitting-and-receiving element module according to claim 5, wherein the wall surface of the second opening section extends in an up-down direction and reflects the light from the light-emitting element upward.

7. The light-emitting-and-receiving element module according to claim 6, wherein an intersection portion of the wall surface of the second opening section that intersects the imaginary line is substantially parallel to a perpendicular line orthogonal to the top surface.

8. The light-emitting-and-receiving element module according to claim 1, further comprising:
a one-conductivity-type semiconductor substrate,
wherein the light-emitting element comprises a plurality of semiconductor layers on a top surface of the semiconductor substrate, and
wherein the light-receiving element comprises a reverse-conductivity-type semiconductor region at a surface layer at the top surface of the semiconductor substrate.

9. A sensor device using the light-emitting-and-receiving element module according to claim 1, wherein the sensor device detects information about an illumination object in accordance with output electric current from the light-receiving element that is output in accordance with reflected light, produced as a result of applying light from the light-emitting element to the illumination object, from the illumination object.

10. The light-emitting-and-receiving element module according to claim 1, comprising:
a housing that defines an accommodation space in which the light-emitting element and the light-receiving element are accommodated;
wherein the housing comprises
a first opening section that allows light from the light-emitting element to exit to an outside, and
a second opening section that guides reflected light from the outside to the light-receiving element, and
wherein the intermediate wall is positioned between the first opening section and the second opening section of the housing.

* * * * *